(12) United States Patent
Chen et al.

(10) Patent No.: US 8,947,968 B2
(45) Date of Patent: Feb. 3, 2015

(54) MEMORY HAVING POWER SAVING MODE

(71) Applicant: ARM Limited, Cambridge (GB)

(72) Inventors: Wang-Kun Chen, Austin, TX (US); Yew Keong Chong, Austin, TX (US); Sriram Thyagarajan, Austin, TX (US); Gus Yeung, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/936,512

(22) Filed: Jul. 8, 2013

(65) Prior Publication Data

US 2015/0009772 A1      Jan. 8, 2015

(51) Int. Cl.
*G11C 7/00*     (2006.01)
*G11C 5/14*     (2006.01)

(52) U.S. Cl.
CPC ....................................... *G11C 5/14* (2013.01)
USPC .......................................... 365/227; 365/203

(58) Field of Classification Search
CPC .................................... G11C 5/14; G11C 7/12
USPC .................................................. 365/203, 227
See application file for complete search history.

(56) References Cited

U.S. PATENT DOCUMENTS

| | | | |
|---|---|---|---|
| 2007/0081409 A1* | 4/2007 | Wuu et al. | 365/227 |
| 2008/0151662 A1* | 6/2008 | Xi et al. | 365/203 |
| 2008/0285367 A1* | 11/2008 | Jung et al. | 365/203 |
| 2010/0226191 A1* | 9/2010 | Jung et al. | 365/203 |

* cited by examiner

*Primary Examiner* — Hoai V Ho
(74) *Attorney, Agent, or Firm* — Nixon & Vanderhye P.C.

(57) ABSTRACT

A memory has a normal mode and a power saving mode. The memory has bitline precharge circuitry which during the normal mode selectively couples a pair of bitlines to a precharge node to charge the bitlines to a given voltage level. During the power saving mode the bitlines are isolated from the precharge node. Voltage control circuitry is provided to maintain the precharge node at a first voltage level during the normal mode and at a second voltage level less than the first voltage level during the power saving mode. By reducing the voltage level at the precharge node during the power saving mode, the amount of inrush current occurring when switching from power saving mode to normal mode can be reduced, and this enables the wakeup time to be reduced when returning from power saving mode to normal mode.

11 Claims, 5 Drawing Sheets

| Mode | PD | PS | PRC | VVDP |
|---|---|---|---|---|
| normal | 0 | 0 | 0/1 | VDD |
| power saving | 0 | 1 | 1 | <VDD |
| power down | 1 | X | X | float |

MEMORY HAVING POWER SAVING MODE

FIELD OF THE INVENTION

The present invention relates to a memory having a power saving mode.

BACKGROUND TO THE INVENTION

A memory may have a power saving mode in which certain portions of the memory are deactivated to reduce leakage. However, typical power saving modes require a long time to wake up to the normal operating mode, and this long latency of wakeup time is not practical for many applications which need to access the memory in short intervals. Often a device using the memory cannot afford to wait many cycles for the memory to wake up from the power saving mode. While prediction schemes could be used to signal that the memory should begin to wake up many cycles earlier than it is actually required, this typically requires complicated or infeasible prediction schemes, which are difficult to implement in a real system. Therefore, in practice many memories do not use any intermediate leakage saving modes. Often the only power saving mode which is actually used in practice is a full power down mode in which the entire memory is switched off, which has a very long wakeup time and so is suitable only when the processor is also powered down.

Hence, the present technique seeks to provide a power saving mode with a faster wakeup time than existing power saving modes.

SUMMARY OF THE INVENTION

Viewed from one aspect, the present invention provides a memory having a plurality of modes of operation including a normal mode and a power saving mode, the memory comprising:

storage circuitry configured to store a data value;

a pair of bitlines for accessing the data value stored by the storage circuitry;

bitline precharge circuitry configured, during the normal mode, to selectively couple the bitlines to a precharge node to charge the bitlines to a voltage level of the precharge node and, during the power saving mode, to isolate the bitlines from the precharge node; and voltage control circuitry configured to control the voltage level of the precharge node;

wherein during the normal mode, the voltage control circuitry is configured to maintain the precharge node at a first voltage level; and during the power saving mode, the voltage control circuitry is configured to maintain the precharge node at a second voltage level less than the first voltage level.

A memory has bitlines for accessing a data value stored in its storage circuitry. Read and write accesses to the data value may be carried out using the bitlines. The memory may also have bitline precharge circuitry for precharging the bitlines to a given voltage level, by coupling the bitlines to a precharge node having that voltage level. Typically, the bitlines may be precharged prior to performing a read or write operation to ensure that any voltage levels remaining on the bitlines after a previous read or write access do not affect the subsequent read or write access. However, precharging the bitlines incurs a leakage cost, and so to reduce leakage a power saving mode can be provided in which the bitlines are isolated from the precharge node.

Typically, when returning from a power saving mode to a normal mode of operation, an inrush current flows as intermediate nodes within the memory are charged. If the inrush current is too large, then this may cause voltage levels to droop in other portions of the system that includes the memory. The voltage droop could cause errors in operation in those other portions. Therefore, typical designs limit the magnitude of the inrush current by providing daisy-chain delay logic to stagger the timings at which different portions of the memory are woken up from the power saving mode. By reducing the amount of circuitry that is woken up simultaneously, the peak inrush current can be reduced. However, this delay logic causes a long delay before the memory is fully awake, and this is why the existing power saving modes have a long wakeup time, making them difficult to use in practice.

In contrast, the present technique provides voltage control circuitry for controlling the voltage level of the precharge node of the bitline precharge circuitry. During the normal mode, the voltage control circuitry maintains the precharge node at a first voltage level, so that when the bitlines are precharged they are brought to the first voltage level. During the power saving mode, the voltage control circuitry maintains the precharge node at a second voltage level which is less than the first voltage level, which reduces the size of the inrush current when later returning to the normal mode from the power saving mode. Therefore, the inrush current can be limited without providing daisy chain delay logic, and so the wakeup time associated with switching from the power saving mode to the normal mode can be reduced for a given size of inrush current. By reducing the wakeup time, this enables the power saving mode to be used more frequently since it can be used in smaller intervals between successive memory accesses. By using the power saving mode more often, the overall power consumption of the memory can be reduced.

Reducing the voltage level of the precharge node during the power saving mode may reduce the size of the inrush current due to several different effects which complement each other. Firstly, the voltage difference between the precharge node and the bitlines may be reduced so that when the bitlines are charged again on returning to the normal mode, less current flows between the precharge node and the bitlines.

Also, the voltage control circuitry may be coupled between the precharge node of the bitline precharge circuitry and a first node for supplying the first voltage level. As the precharge node, instead of being coupled directly to the first node, is now coupled to the first node via the voltage control circuitry, there is an additional impedance between the first node and the bitlines which reduces the amount of current flowing when the bitlines are charged to the first voltage level when returning to the normal mode.

The voltage control circuitry may take various forms. In one example, the voltage control circuitry may comprise a power saving transistor which is coupled between the first node and the precharge node. During the normal mode, the power saving transistor may be in a conductive state so as to charge the precharge node to the first voltage level of the first node. In the power saving mode, the power saving transistor may be placed in a less conductive state. In one embodiment, this can cause the precharge node to have a floating voltage which is less than the first voltage level. In another embodiment, there may be other elements included in the voltage control circuitry for regulating the voltage level of the precharge node, and switching the power saving transistor to the less conductive state may allow that other circuit to provide a voltage reduction.

In another example, the voltage control circuitry may comprise voltage limiting circuitry which during the power saving mode provides a voltage drop between the first node and the precharge node so that the voltage level of the precharge node is less in the first voltage level. This regulates the voltage level of the precharge node more precisely during the power saving mode, preventing a floating voltage. By maintaining the precharge node at a reduced non-floating voltage level, the precharge node does not take as long to charge up to the first voltage level when returning from the power saving mode, reducing the amount of inrush current.

For example, the voltage limiting circuitry may comprise a diode-connected transistor coupled between the first node and the precharge node. The diode-connected transistor has its gate terminal coupled to its drain terminal during at least the power saving mode so that a voltage drop corresponding to the threshold voltage of the diode-connected transistor occurs between the first node and the precharge node.

In another example, the voltage limiting circuitry and power saving transistor may be provided in parallel with one another so that during the normal mode the power saving transistor is conductive and this brings the voltage level of the precharge node to the first voltage level, while during the power saving mode the power saving transistor is less conductive so that the voltage limiting circuitry drops the precharge node voltage level to the second voltage level.

The bitline precharge circuitry may receive a precharge signal which determines during the normal mode whether the bitline precharge circuitry couples the bitlines to the precharge node. If the precharge signal has a first state then the bitlines are coupled to the precharge node while if the precharge signal has a second state then the bitlines are isolated from the precharged node. Typically, the precharge signal is provided in the first state during a precharge phase of a read or write operation to precharge the bitlines to the first voltage level, and is then switched to the second state to decouple the precharge node from the bitlines so that during a subsequent read or write operation the voltage level of the bitlines changes to represent the data values being read or written.

During the power saving mode, the precharge signal may be provided to the bitline precharge circuitry in the second state so that the bitlines are isolated from the precharge node. When switching to the normal mode, the precharge signal may be switched to the first state at the same time as switching to the normal mode or at a later time.

During the power saving mode, as well as powering down the bitline precharge circuitry to decouple the bitlines from the precharge node, it may also be possible to power down portions of the storage circuitry itself. However, this could result in a greater inrush current when waking up from the power saving mode, which could make it difficult to provide a sufficiently fast wakeup time as it may be necessary to provide more daisy chained delays.

Therefore, to provide a fast wake up from the power saving mode, it may be preferable for the storage circuitry to remain powered during the power saving mode. Hence, the power saving mode may be a bitline-only power down mode in which leakage is reduced by discharging the bitlines but the storage cells remain active. This can still provide a significant power saving, since the bitlines have a given capacitance and continuing to perform precharge cycles in which the bitlines are repeatedly charged may consume a significant amount of power, which can be saved during the power saving mode.

The normal mode and power saving mode need not be the only modes of operation of the memory. For example, the memory may also have a power down mode in which it is fully isolated from a power supply. In the power mode, both the storage circuitry and the bitline precharge circuitry may be powered down. The memory may have a power down transistor coupled between the first node and a voltage supply input for receiving the first voltage level. During both the normal mode and the power saving mode, the power down transistor may be in a conductive state. In the power down mode, the power down transistor may be placed in a less conductive state to isolate the first node from the voltage supply node. Hence, the power down mode can be used when no memory accesses are required for a relatively long period of time, while the power saving mode can be used to provide a power saving during short periods between successive memory accesses, since the wakeup time of the power saving mode may be much less than the wakeup time of the power down mode.

While the present technique can be applied to various types of memory, it is particularly useful when the memory comprises static random access memory (SRAM), because leakage in the bitlines represents a significant portion of the power consumption of an SRAM.

Viewed from a further aspect, the present invention provides a memory having a plurality of modes of operation including a normal mode and a power saving mode, the memory comprising:

storage means for storing a data value;

a pair of bitline means for accessing the data value stored by the storage means;

bitline precharge means configured, during the normal mode, to selectively couple the bitline means to a precharge node means for charging the bitline means to a voltage level of the precharge node means and, during the power saving mode, to isolate the bitline means from the precharge node means; and voltage control means for controlling the voltage level of the precharge node means;

wherein during the normal mode, the voltage control means is configured to maintain the precharge node means at a first voltage level; and during the power saving mode, the voltage control means is configured to maintain the precharge node means at a second voltage level less than the first voltage level.

Viewed from another aspect, the present invention provides a method of operating a memory having a plurality of modes of operation including a normal mode and a power saving mode, the memory comprising storage circuitry configured to store a data value and a pair of bitlines for accessing the data value stored by the storage circuitry; the method comprising:

during the normal mode, maintaining a precharge node at a first voltage level, and selectively coupling the bitlines to the precharge node to charge the bitlines to the first voltage level of the precharge node; and during the power saving mode, isolating the bitlines from the precharge node, and maintaining the precharge node at a second voltage level less than the first voltage level.

The above, and other objects, features and advantages of this invention will be apparent from the following detailed description of illustrative embodiments which is to be read in connection with the accompanying drawings.

DESCRIPTION OF EXAMPLE EMBODIMENTS

Figure 1:
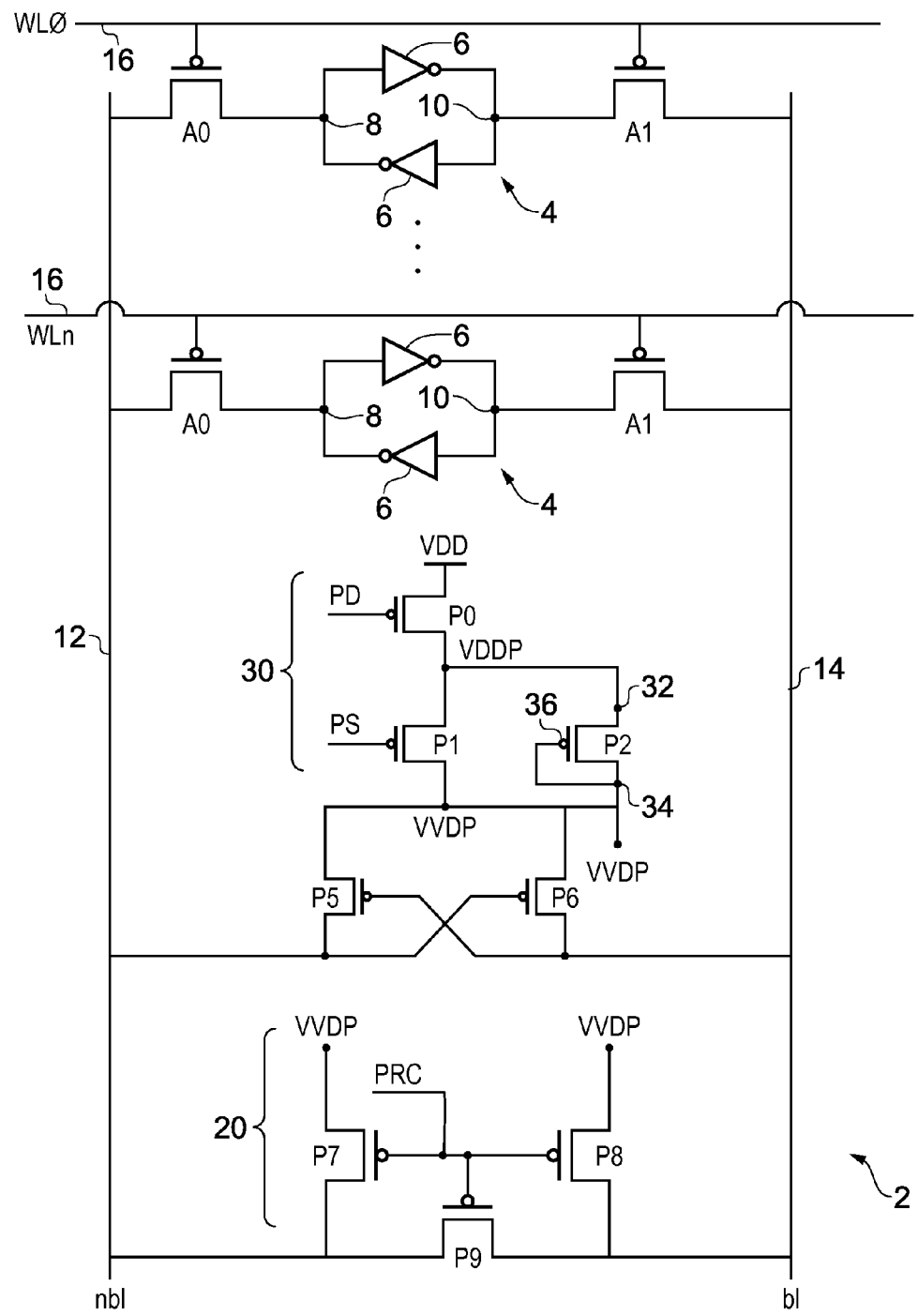
FIG. 1 schematically illustrates an example of a memory having a power saving mode.

FIG. 1 schematically illustrates a portion of a memory 2 for storing data values. FIG. 1 shows a column of memory cells 4 each storing a bit of a data value. The memory 2 has several such columns to form an array of cells 4 arranged in rows and columns. Each memory cell 4 comprises a pair of cross coupled inverters 6 which form a latch which can be placed in two opposite states to represent bit values of 0 and 1 respectively. In one of the states, a first node 8 of the latch is logical high (1) and a second node 10 is logical low (0), while in the other state the first node 8 is logical low and the second node 10 is logical high. Each column of memory cells has a pair of bitlines 12, 14 which are used to access the values stored in the cells 4. Access control transistors A0, A1 couple each memory cell 4 to the bitlines 12, 14. Word lines 16 corresponding to each row of memory cells 4 control which access control transistors A0, A1 are conductive. A specific cell 4 to be written to or read from can be selected using the bitlines 12, 14 of the corresponding column and the wordline 16 of the corresponding row.

The memory 2 has bitline precharge circuitry 20 for selectively precharging the bitlines 12, 14 to a voltage level of a precharge node VVDP. The bitline precharge circuitry has a pair of precharging transistors P7, P8 which are each coupled between the precharge node VVDP and one of the respective bitlines 12, 14. A precharge signal PRC is applied to the gate of the precharge transistors P7, P8. When the precharge signal PRC is low then the precharge transistors P7, P8 are conductive to couple the bitlines 12, 14 to the precharge node VVDP. When the precharge signal PRC is high then the precharge transistors P7, P8 are less conductive to isolate the bitlines from the precharge node. The bitline precharge circuitry 20 also includes a balancing transistor P9 which couples the bitlines 12, 14 together and is conductive when the precharge signal PRC is low and less conductive when the precharge signal PRC is high.

During a precharge phase of a read or write operation, the precharge signal PRC is brought low so that the precharge transistors P7, P8 and balancing transistor P9 are switched on. The precharge transistors P7, P8 charge the bitlines 12, 14 to the first voltage level at the VVDP node. The balancing transistor P9 equalizes the voltage level of the bitlines 12, 14 to ensure that any subsequent difference in the voltage level of the bitlines 12, 14 is solely due to the data values being read or written in the read or write operation. At the end of the precharge phase, the precharge signal PRC is brought high to decouple the bitlines 12, 14 from each other and from the precharge node VVDP.

For a read operation, the word line 16 for a selected cell 4 is activated to turn on the corresponding access transistors A0, A1 and couple the selected cell to the bitlines 12, 14. Depending on the bit value stored by the storage cell, the voltage level of one of the bitlines 12, 14 will drop to match the voltage level of the corresponding node 8, 10 of the storage cell 4. The memory 2 has cross coupled transistors P5, P6 coupled between the bitlines 12, 14 to reinforce this change of bitline state so that when the voltage level of one of the bitlines 12, 14 drops, this causes the transistor P5, P6 associated with the other bitline 12, 14 to be switched on, coupling the other bitline 12, 14 to the VVDP node to maintain it at a high voltage level. The voltage levels of the two bitlines 12, 14 are sensed using sense amplifiers coupled to the bitlines 12, 14, and a bit value of 0 or 1 is determined based on which of the bitlines 12, 14 is high and which is low.

For a write operation, following the end of the precharge phase, one of the bitlines 12, 14 is driven high and the other is driven low to correspond to the bit value to be written to a selected storage cell 4. The word line 16 corresponding to the selected storage cell 4 is then activated to make the corresponding access transistors A0, A1 conductive so that the values driven on the bitlines 12, 14 are written to the selected storage cell 4, causing the latch to flip states if necessary.

The memory 2 has voltage control circuitry 30 for controlling a voltage level of the VVDP node to which the bitlines are coupled during the precharge phase. The voltage control circuitry has a power down transistor P0, a power saving transistor P1 and a diode-connected transistor P2. The power down transistor P0 is connected between a power supply input VDD and a first node VDDP and controls switching in and out of a power down mode in which the memory 2 is fully powered down. The power down transistor P0 receives a power down control signal PD which when low controls the power down transistor P0 to be conductive to allow the VDD level to pass to the first node VDDP from which other components are supplied with power. When the power down control signal PD goes high then the power down transistor P0 is made less conductive to isolate the other components from the power supply VDD. Although not shown in FIG. 1 for conciseness, the storage cells 4 may have power down transistors similar to transistor P0 for powering down the storage cells when the power down control signal PD transitions high and reactivating the storage cells 4 when the signal PD becomes low again.

The power saving transistor P1 and the diode-connected transistor P2 are coupled in parallel between the first node VDDP and the precharge node VVDP. The power saving transistor P1 receives a power saving control signal PS. During the normal mode the power saving control signal PS is low and the power saving transistor P1 is conductive to allow the VDD level to pass from the first node VDDP to the precharge node VVDP. Hence, during the normal mode, activating the precharge signal PRC by bringing it low causes the bitlines 12, 14 to be charged to the VDD voltage level at the precharge node VVDP.

During the power saving mode, the precharge signal PRC is brought high to turn off transistors P7, P8, P9 and decouple the bitlines from the precharge node VVDP. For example, while during the normal mode the precharge signal PRC is switched between its low and high levels in response to cycles of a clock signal to provide a precharge phase in each cycle, during the power saving mode the clock signal may be gated to hold the precharge signal at the high level. This saves power by avoiding the leakage incurred in repeatedly charging up capacitance in the bitlines 12, 14.

Also, during the power saving mode the power saving signal PS transitions high, turning off the power saving transistor P1. This leaves the diode-connected transistor P2 as the dominant conduction path between the first node VDDP and the precharge node VVDP. The diode-connected transistor has its source terminal 32 coupled to the first node VDDP and its drain terminal 34 coupled to the precharge node VVDP. The gate terminal 36 of the diode-connected transistor P2 is coupled to the drain terminal 34, which means that there is a threshold voltage drop across the diode-connected transistor P2 between the first node VDDP and the precharge node VVDP, causing the voltage level at the precharge node VVDP to drop relative to the VDD level. This helps to limit the size of the inrush current spikes when returning from the power saving mode to the normal mode.

Figures 2, 6:
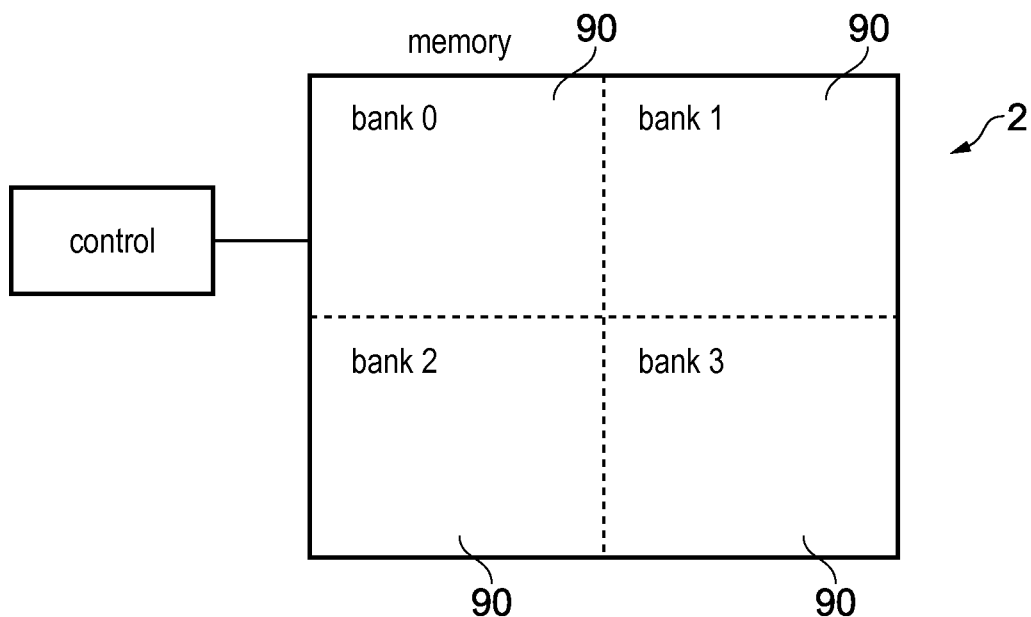
FIG. 2 is a table showing different operating modes of the memory in FIG. 1.
FIG. 6 illustrates an example of staggering the timings at which different banks of memory cells are woken up from the power saving mode, which is no longer necessary when using the power saving mode of the present technique.

FIG. 2 shows a table indicating the values of the power down signal PD, the power saving signal PS and the precharge signal PRC used to select the normal, power saving and power down modes, and the voltage level of the precharge node VVDP during each power mode. In the example shown in FIG. 1, the precharge node voltage level is less than VDD by an amount dependent on the threshold voltage of the diode connected transistor P2.

It would also be possible to omit the diode connected transistor P2 altogether so that during the power saving mode there is no conductive transistor connecting the first node VDDP and the precharge node VVDP. In this case, the voltage level at the precharge node VVDP would float to a level less than VDD.

Figure 3:
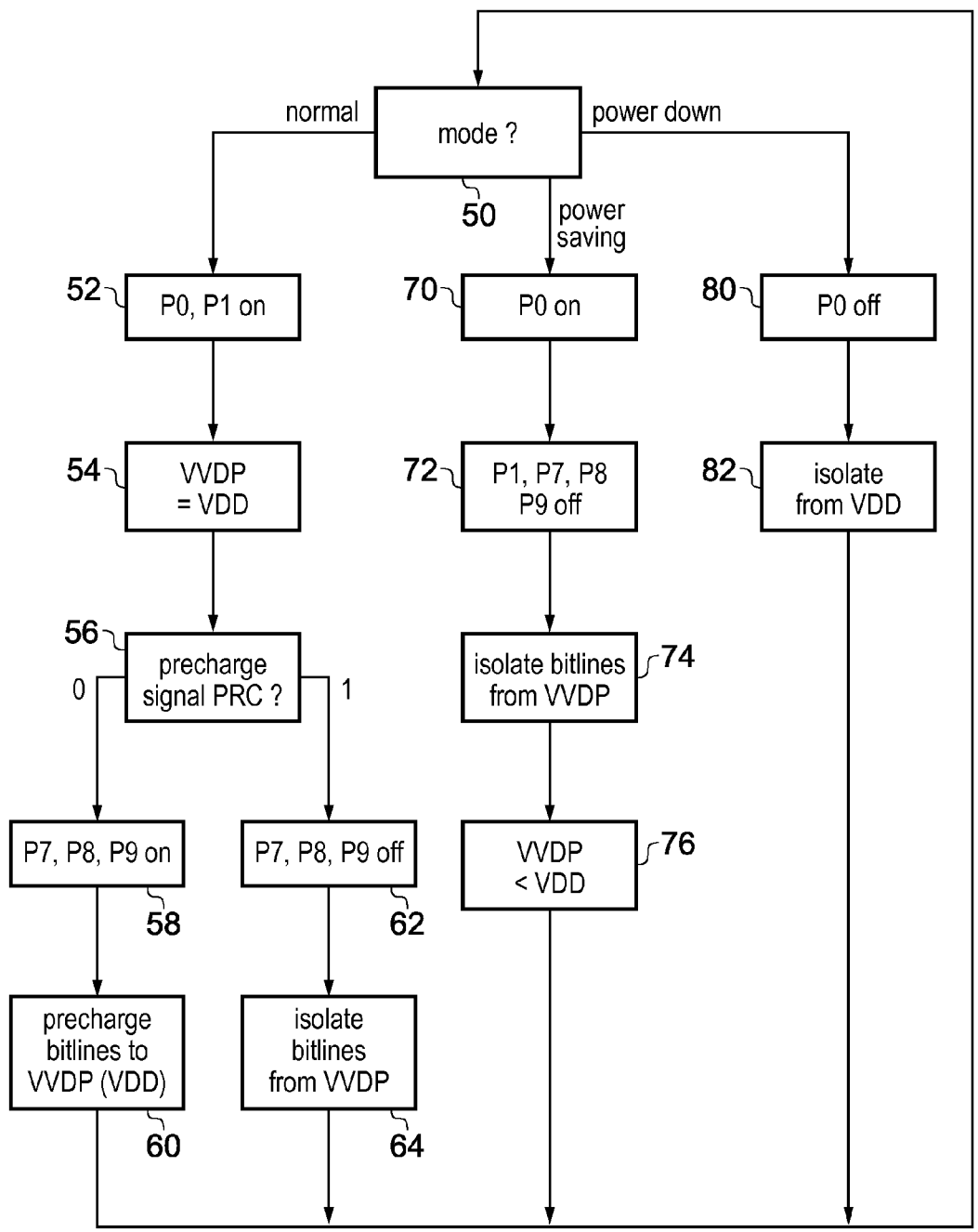
FIG. 3 is a flow diagram showing a method of placing the memory in the different operating modes.

FIG. 3 shows a method of operating the memory 2 in the respective modes of operation. At step 50, the desired mode of operation is determined. For example, there may be some control circuitry not shown in FIG. 1 which decides which mode the memory should operate in. If the memory is to operate in the normal mode, then at step 52 the control circuitry turns on transistors P0, P1 by bringing low the power down signal PD and the power saving signal PS. This brings the precharge node VVDP to the VDD level at step 54. At step 56 the level of the precharge signal PRC is determined. If the precharge signal is low, then at step 58 precharge transistors P7, P8 and balancing transistor P9 are turned on and at step 60 the bitlines 12, 14 are coupled to the VVDP node to charge the bitlines to VDD voltage level. On the other hand, if the precharge signal is high then at step 62 the precharge transistors P7 and P8 and the balancing transistor P9 are off and this isolates the bitlines from the VVDP mode at step 64.

On the other hand, if at step 50 it is determined that the memory should operate in the power saving mode, then at step 70 the power down signal is low and transistor P0 is still on. At step 72 transistors P1, P7, P8 and P9 are turned off by bringing high the power saving signal PS and the precharge signal PRC. This isolates the bitlines 12, 14 from the VVDP node (step 74) to reduce power consumption by avoiding precharging the bitlines. Since the power saving transistor P1 has been turned off, diode-connected transistor P2 is the dominant conduction path and it limits the voltage of the VVDP node by providing a voltage drop between the VDDP and VVDP nodes. This causes the precharge node VVDP to drop to a reduced voltage (step 76) which differs from the VDD level by an amount depending on the threshold voltage of the diode-connected transistor P2. The reduced voltage at the source of the precharge transistors P7, P8 helps to reduce the magnitude of the inrush current when the system is woken up back to normal mode from the power saving mode.

If at step 50 it is determined that the memory should switch to the power down mode, then at step 80 the power down transistor P0 is turned off by bringing high the power down signal PD, to isolate the other components from the VDD power supply at step 82. In the power down mode, the storage cells may also be powered down so that they lose their stored data values. This provides a deeper power saving mode, but one which takes longer to wake up from than the power saving mode in which the bitline precharger is powered down but the storage cells 4 remain active.

Figure 4:
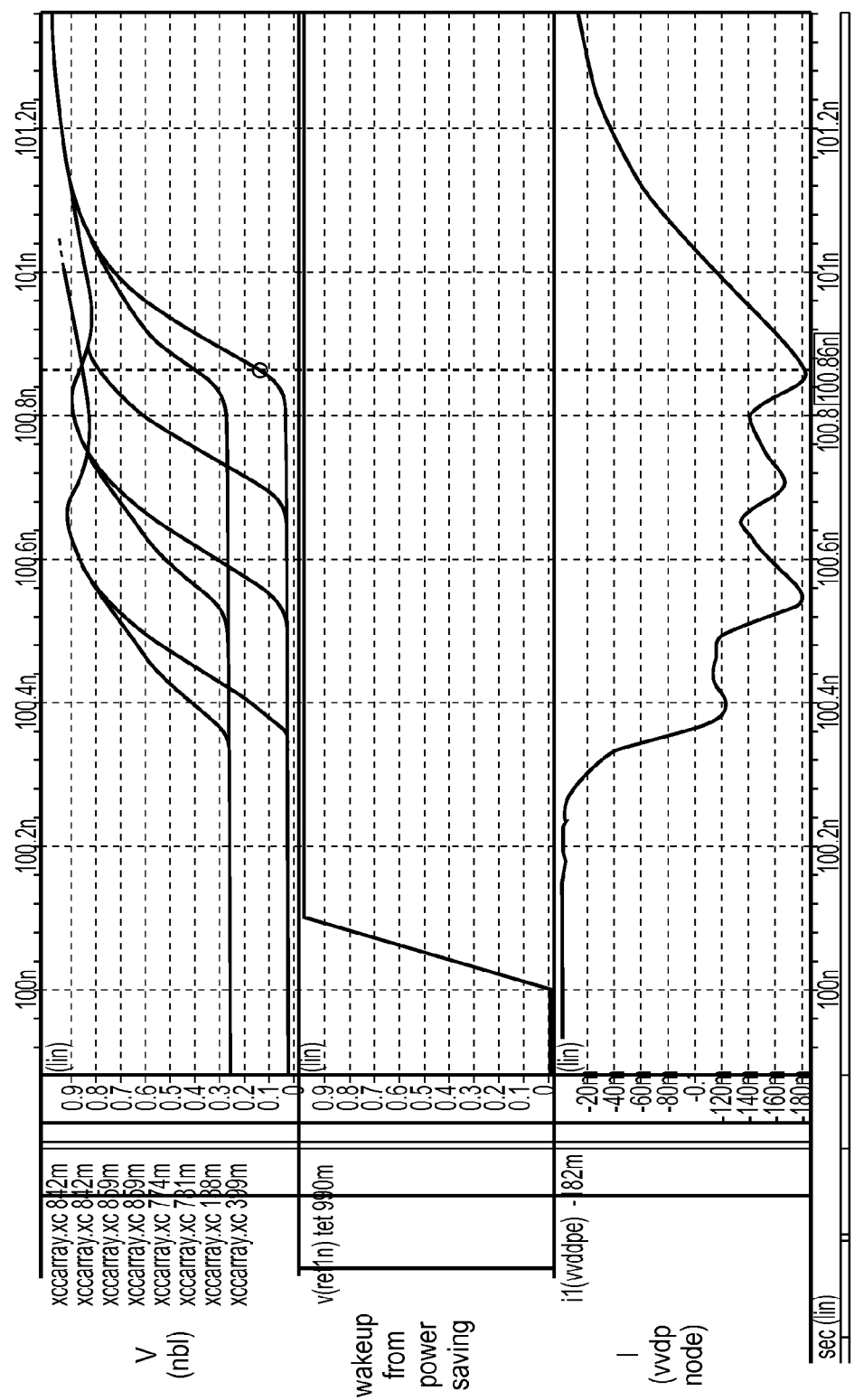
FIGS. 4 and 5 illustrate simulation results showing a reduction in inrush current.
Figure 5:
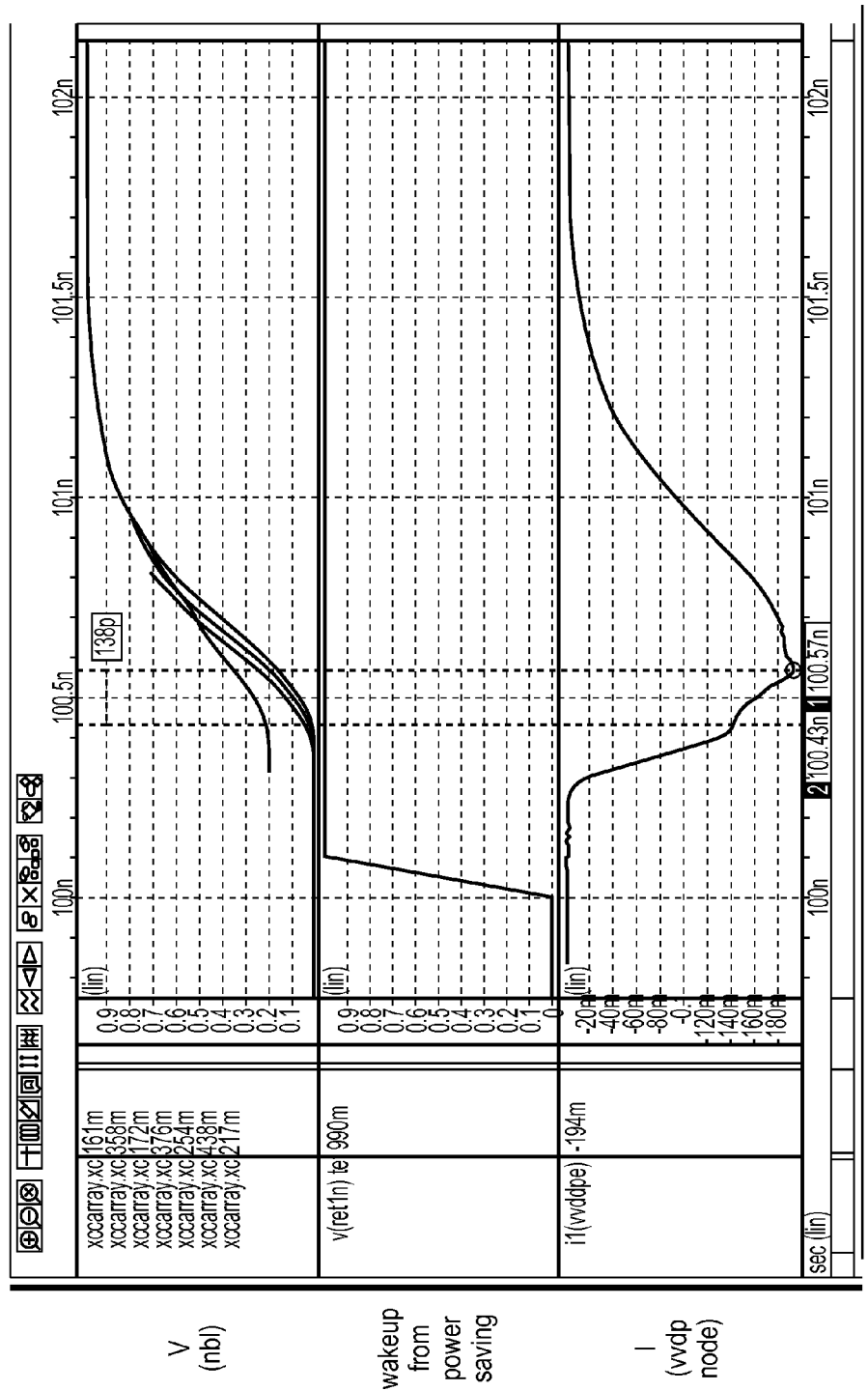

FIGS. 4 and 5 are graphs showing simulation results representing the wake up from the power saving mode to the normal mode. FIG. 4 shows an example of a four-step wake up. As shown in FIG. 6, the memory 2 may comprise four banks 90 of memory cells or memory columns which may be woken up separately at different times. By staggering the switching timings for the respective banks 90, the peak inrush current can be reduced. The middle plot of FIG. 4 shows a signal triggering the wake up from the power saving mode, which may be used to trigger the power saving control signal PS and precharge signal PRC to switch low to return to normal mode. As shown in the top plot of FIG. 4, with four banks 90 being woken up at different switching times, the bitline charging is staggered. As shown in the bottom plot, peak inrush current is around 182 milliamps, which is an acceptable level for most applications.

FIG. 5 shows another simulation result in which the memory 2 is woken up in one step rather than in four steps. All of the banks 90 shown in FIG. 6 may be woken up simultaneously. One would expect that this would result in a much greater peak inrush current. However, as shown in the bottom plot of FIG. 5, the peak inrush current is around 194 milliamps which is not significantly different to in FIG. 4. Therefore, it is not essential to provide delay lines for staggering the wake up timings of the different banks 90 of memory 2. The present technique of source biasing the precharge transistors P7, P8 during the power saving mode using the diode-connected transistor P2 is sufficient to achieve an inrush current reduction. Simulations have shown that the peak inrush current is about 30% less than previous techniques, enabling the wake up sequence to be four times faster for the same level of inrush current.

By reducing the peak inrush current, the wake up sequence can be sped up since it is no longer necessary to provide as many delay lines for staggering switching timings, and depending on the size of the memory, it may be possible to eliminate such delay lines altogether. By providing a faster wakeup time, the power saving mode can be used more often during smaller gaps between memory accesses. The power saving mode can be used to provide a "quick nap" where the memory 2 temporarily reduces leakage during a moment when no memory accesses are required, by deactivating the bit lines. The memory can quickly come back out of the power saving mode if necessary to service another memory access, without requiring prediction logic to predict when this will be required.

While FIG. 1 shows a particular example of a memory 2 having a power saving mode, modifications may be made. For example, the diode-connected transistor P2 could be omitted so that the power saving transistor P1 is the only transistor coupling the first node VDDP to the precharge node VVDP. In this case, during the power saving mode the voltage level and the precharge node VVDP would float so that it is less than the VVD level which it has during the normal mode.

Also, it may be possible to provide a single transistor which provides the functions of both the power saving transistor P1 and the diode-connected transistor P2. For example, the coupling between the drain terminal 34 and gate terminal 36 of the diode transistor may be selective so that these terminals are only coupled during the power saving mode and during the normal mode the gate terminal 36 of the diode-connected transistor P2 may instead be coupled to the power saving signal PS. A switching transistor could be used to select which of the power saving signal PS and the drain terminal 34 should be coupled to the gate terminal 36 of the diode-connected transistor P2.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A memory having a plurality of modes of operation including a normal mode and a power saving mode, the memory comprising:
   storage circuitry configured to store a data value;
   a pair of bitlines for accessing the data value stored by the storage circuitry;
   bitline precharge circuitry configured, during the normal mode, to selectively couple the bitlines to a precharge node to charge the bitlines to a voltage level of the precharge node and, during the power saving mode, to isolate the bitlines from the precharge node;
   voltage control circuitry configured to control the voltage level of the precharge node; wherein during the normal mode, the voltage control circuitry is configured to maintain the precharge node at a first voltage level and, during the power saving mode, the voltage control circuitry is configured to maintain the precharge node at a second voltage level less than the first voltage level, wherein the voltage control circuitry is coupled between the precharge node and a first node for supplying the first voltage level and, wherein the voltage control circuitry comprises voltage limiting circuitry configured during the power saving mode to provide a voltage drop between the first node and the precharge node, wherein the voltage limiting circuitry comprises a diode-connected transistor coupled between the first node and the precharge node.

2. The memory according to claim 1, wherein the diode-connected transistor has a source terminal coupled to the first node, a drain terminal coupled to the precharge node, and a gate terminal coupled to the drain terminal during at least the power saving mode.

3. A memory having a plurality of modes of operation including a normal mode and a power saving mode, the memory comprising;
   storage circuitry configured to store a data value;
   a pair of bitlines for accessing the data value stored by the storage circuitry;
   bitline precharge circuitry configured, during the normal mode, to selectively couple the bitlines to a precharge node to charge the bitlines to a voltage level of the precharge node and, during the power saving mode, to isolate the bitlines from the precharge node;
   voltage control circuitry configured to control the voltage level of the precharge node; wherein during the normal mode, the voltage control circuitry is configured to maintain the precharge node at a first voltage level and, during the power saving mode, the voltage control circuitry is configured to maintain the precharge node at a second voltage level less than the first voltage level, wherein the voltage control circuitry is coupled between the precharge node and a first node for supplying the first voltage level; and
   a power down transistor coupled between the first node and a voltage supply input for receiving the first voltage level, wherein in the normal mode and the power saving mode, the power down transistor is in a conductive state and the memory has a power down mode in which the power down transistor is in a less conductive state to isolate the first node from the voltage supply node.

4. The memory according to claim 3, wherein the voltage control circuitry comprises a power saving transistor coupled between the first node and the precharge node; and the power saving transistor is configured to be in a conductive state during the normal mode, and in a less conductive state during the power saving mode.

5. The memory according to claim 3, wherein the voltage control circuitry comprises voltage limiting circuitry configured during the power saving mode to provide a voltage drop between the first node and the precharge node.

6. The memory according to claim 3, wherein the bitline precharge circuitry is configured to receive a precharge signal; and
   during the normal mode, the bitline precharge circuitry is configured to couple the bitlines to the precharge node if the precharge signal has a first state and to isolate the bitlines from the precharge node if the precharge signal has a second state.

7. The memory according to claim 6, wherein during the power saving mode, the precharge signal has the second state.

8. The memory according to claim 3, wherein during the power saving mode, the storage circuitry remains powered.

9. The memory according to claim 3, wherein the memory comprises SRAM.

10. A memory having a plurality of modes of operation including a normal mode and a power saving mode, the memory comprising:
    storage means for storing a data value;
    a pair of bitline means for accessing the data value stored by the storage means;
    bitline precharge means configured, during the normal mode, to selectively couple the bitline means to a precharge node means for charging the bitline means to a voltage level of the precharge node means and, during the power saving mode, to isolate the bitline means from the precharge node means;
    voltage control means for controlling the voltage level of the precharge node means, wherein during the normal mode, the voltage control means is configured to maintain the precharge node means at a first voltage level and during the power saving mode, the voltage control means is configured to maintain the precharge node means at a second voltage level less than the first voltage level, wherein the voltage control means is coupled between the precharge node and a first node for supplying the first voltage level; and
    power down transistor means, coupled between the first node and a voltage supply input, for receiving the first voltage level, wherein in the normal mode and the power saving mode, the power down transistor means is in a conductive state and in a power down mode, the power down transistor means is in a less conductive state as compared to said conductive state to isolate the first node from the voltage supply node.

11. A method of operating a memory having a plurality of modes of operation including a normal mode and a power saving mode, the memory comprising storage circuitry configured to store a data value and a pair of bitlines for accessing the data value stored by the storage circuitry; the method comprising:
    during the normal mode, maintaining a precharge node at a first voltage level, and selectively coupling the bitlines to the precharge node to charge the bitlines to the first voltage level of the precharge node; and
    during the power saving mode, isolating the bitlines from the precharge node, and maintaining the precharge node at a second voltage level less than the first voltage level, wherein the voltage control circuitry is coupled between the precharge node and a first node for supplying the first voltage level; and receiving the first voltage level at a power down transistor between the first node and a voltage supply input, wherein in the normal mode and the power saving mode, the power down transistor is in a conductive state and in a power down mode, the power down transistor is in a less conductive state as compared to said conductive state to thereby isolate the first node from the voltage supply node.

\* \* \* \* \*